US010643326B2

(12) United States Patent
Toyoda et al.

(10) Patent No.: US 10,643,326 B2
(45) Date of Patent: May 5, 2020

(54) SEMICONDUCTOR MEASUREMENT APPARATUS AND COMPUTER PROGRAM

(71) Applicant: Hitachi High-Technologies Corporation, Minato-ku, Tokyo (JP)

(72) Inventors: Yasutaka Toyoda, Tokyo (JP); Ryoichi Matsuoka, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 76 days.

(21) Appl. No.: 14/377,239

(22) PCT Filed: Feb. 12, 2013

(86) PCT No.: PCT/JP2013/053172
§ 371 (c)(1),
(2) Date: Aug. 7, 2014

(87) PCT Pub. No.: WO2013/122021
PCT Pub. Date: Aug. 22, 2013

(65) Prior Publication Data
US 2015/0009319 A1  Jan. 8, 2015

(30) Foreign Application Priority Data
Feb. 14, 2012  (JP) .................................. 2012-029055

(51) Int. Cl.
*G06T 7/00* (2017.01)
*H01L 21/66* (2006.01)
(Continued)

(52) U.S. Cl.
CPC ....... *G06T 7/001* (2013.01); *G01N 21/95607* (2013.01); *H01L 22/12* (2013.01);
(Continued)

(58) Field of Classification Search
CPC . G06T 2207/10004; G06T 2207/10061; G06T 2207/30148; G06T 7/0002;
(Continued)

(56) References Cited

U.S. PATENT DOCUMENTS 7,707,192 B1 *  4/2010  Lu .......................... G06Q 10/00
                                                        707/687
7,796,801 B2    9/2010  Kitamura et al.
(Continued)

FOREIGN PATENT DOCUMENTS

| JP | 2004-163420 A | 6/2004 |
| JP | 2007-248087 A | 9/2007 |
| JP | 2011-191296 A | 9/2011 |
| WO | WO 2007/094439 A1 | 8/2007 |

OTHER PUBLICATIONS

International Search Report (PCT/ISA/210) dated Apr. 23, 2013 with English translation (four pages).

*Primary Examiner* — Daniel Chang
(74) *Attorney, Agent, or Firm* — Crowell & Moring LLP

(57) ABSTRACT

One of the objects of the present invention is to provide a semiconductor measurement apparatus capable of obtaining a measurement result that appropriately reflects the deformation of a pattern even if plural causes for the deformation of the pattern exist together. In order to attain the above object, the semiconductor measurement apparatus is proposed in the following way. The semiconductor measurement apparatus is capable of measuring the dimensions between plural measurement points of different positions of the edge of a reference pattern and plural corresponding points of the circuit pattern of an electronic device, in which the corresponding points correspond to the plural measurement points. In addition, the semiconductor measurement apparatus is capable of measuring the spacings between the circuit pattern and the reference pattern, both of which exist in a predefined measurement area, selecting a second mea-
(Continued)

sured value aggregation from a first measured value aggregation comprised of measured values at plural points in the measurement area based on a predefined sampling condition, and calculating the measurement value based on the second measured value aggregation.

10 Claims, 11 Drawing Sheets

(51) Int. Cl.
*G01N 21/956* (2006.01)
*G06K 9/00* (2006.01)

(52) U.S. Cl.
CPC ............ *G01B 2210/56* (2013.01); *G06K 9/00* (2013.01); *G06T 7/0006* (2013.01); *G06T 2207/10004* (2013.01); *G06T 2207/10061* (2013.01); *G06T 2207/30148* (2013.01); *H01J 2237/24578* (2013.01)

(58) Field of Classification Search
CPC ..... G06T 7/001; G06T 7/0044; G06T 7/0085; G06T 7/0006; H01L 2224/94; G06K 9/00
USPC ......... 250/304, 306, 307, 310, 311, 396 ML, 250/396 R, 398, 443.1, 492.3, 505.1; 382/144, 145, 147, 149, 151; 348/86
See application file for complete search history.

(56) References Cited

U.S. PATENT DOCUMENTS

| | | | |
|---|---|---|---|
| 8,019,161 B2 | 9/2011 | Morokuma et al. | |
| 2001/0019109 A1* | 9/2001 | Yamaguchi | G01N 23/04 250/311 |
| 2002/0030735 A1* | 3/2002 | Yamada | B60R 1/00 348/47 |
| 2002/0113234 A1* | 8/2002 | Okuda | G01N 21/9501 257/48 |
| 2004/0062447 A1* | 4/2004 | Suarez | H04N 19/63 382/240 |
| 2005/0146714 A1* | 7/2005 | Kitamura | G06K 9/00 356/237.2 |
| 2006/0036600 A1* | 2/2006 | Chaudhuri | G06F 16/2462 |
| 2006/0245636 A1* | 11/2006 | Kitamura | G06K 9/00 382/149 |
| 2007/0221842 A1* | 9/2007 | Morokuma | G01N 23/2251 250/307 |
| 2008/0163140 A1* | 7/2008 | Fouquet | G03F 1/84 700/110 |
| 2009/0052765 A1* | 2/2009 | Toyoda | G06K 9/00 382/149 |
| 2009/0218491 A1 | 9/2009 | Morokuma et al. | |
| 2010/0158345 A1* | 6/2010 | Kitamura | G06T 7/0006 382/145 |
| 2010/0215247 A1 | 8/2010 | Kitamura et al. | |
| 2011/0158543 A1 | 6/2011 | Morokuma et al. | |

* cited by examiner

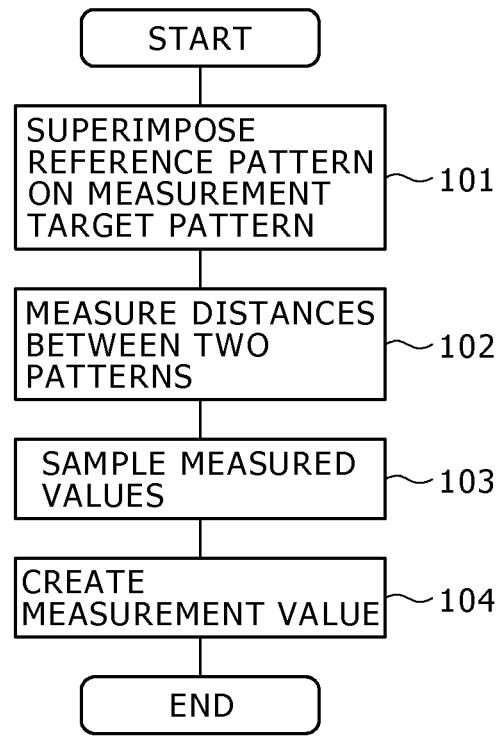
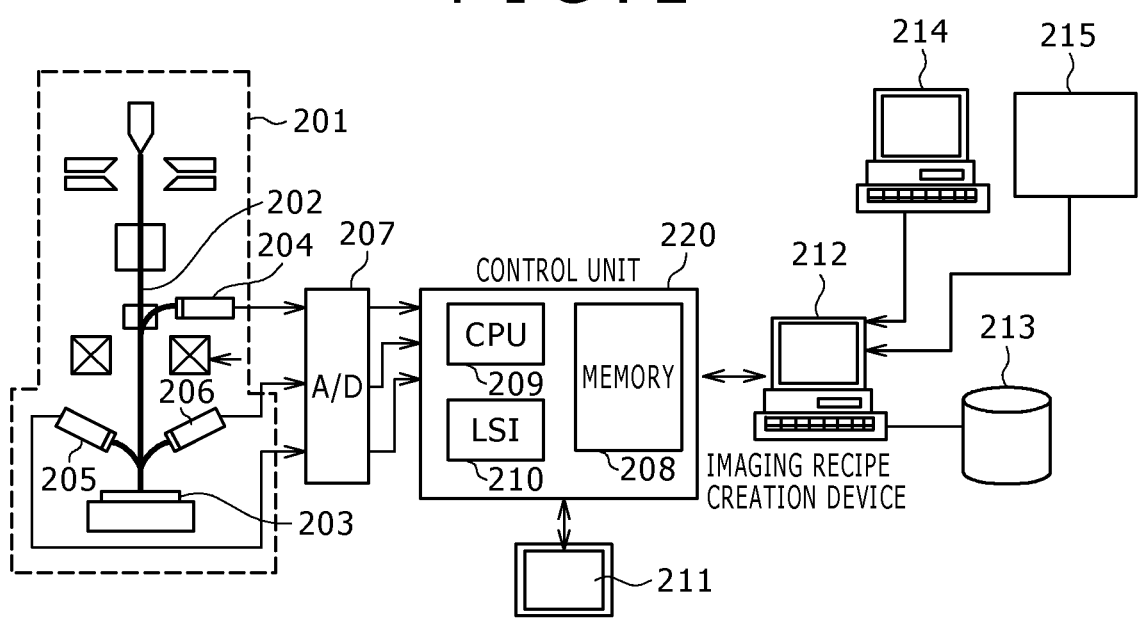

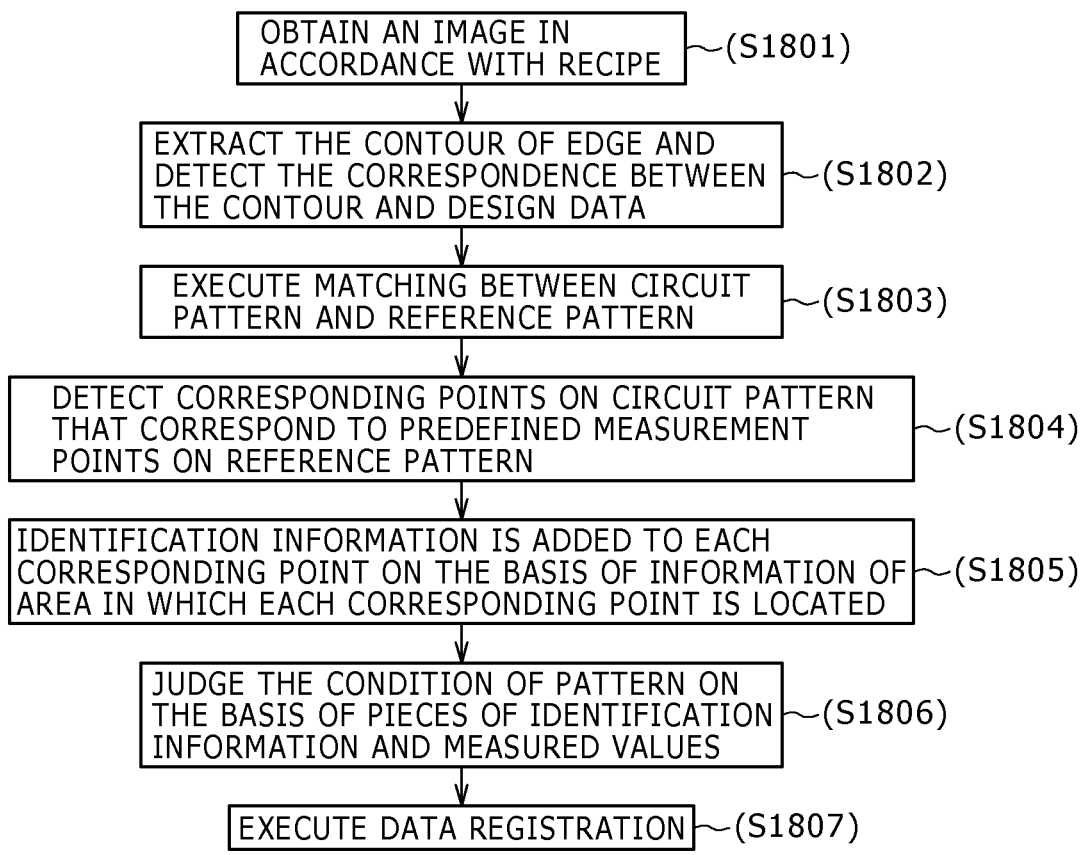
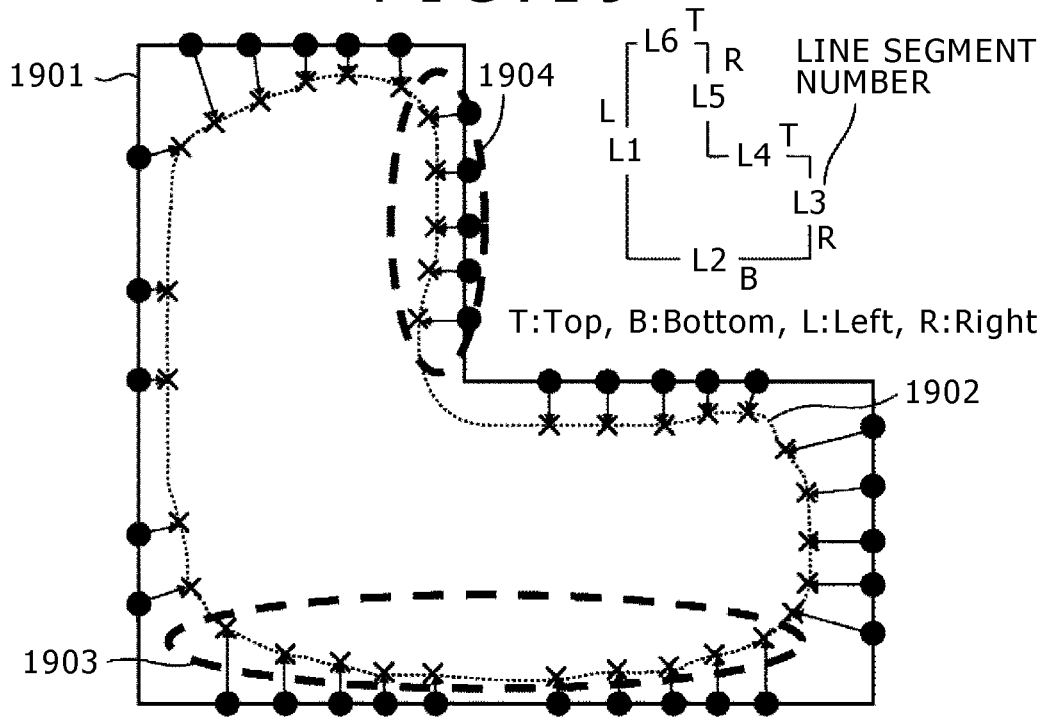

SEMICONDUCTOR MEASUREMENT APPARATUS AND COMPUTER PROGRAM

TECHNICAL FIELD

The present invention relates to semiconductor measurement apparatuses that create the measurement values and inspection results of circuit patterns of electronic devices by performing the comparison inspection and deviation measurement between the circuit patterns and reference patterns, and more particularly relates to a semiconductor apparatus that measures the dimensions between the edge obtained based on image pickup data of an electronic device and the edge of a reference pattern.

BACKGROUND ART

Since the miniaturization and multilayerization of semiconductor devices have been advanced and the logics of semiconductor devices have also been complicated in recent years, the manufacture of semiconductor devices has become very difficult. As a result, defects owing to the manufacturing process of semiconductor devices frequently tends to occur, therefore it becomes important to accurately inspect these defects. A defect review SEM (defect review-scanning electron microscope: DR-SEM) that reviews defects, and a CD-SEM (critical dimension-SEM) that measures pattern dimensions based on the coordinate information of defects obtained by a higher-level defect inspection apparatus are used for inspecting these defects in detail, and for measuring these defects. These apparatuses performs the inspection and measurement of circuit patterns corresponding to inspection coordinates based on an optical simulation and based on the inspection result of an optical inspection apparatus.

Patent Literatures 1 and 2 disclose a technique in which the shape of a circuit pattern and that of a reference pattern are compared with each other (for example, the deviation between the two patterns are measured) in order to accurately grasp the state of a defect owing to, for example, the optical proximity effect (OPE).

CITATION LIST

Patent Literature

[Patent Literature 1] Japanese Unexamined Patent Application Publication No. 2004-163420 (corresponding U.S. Pat. No. 7,796,801)
[Patent Literature 2] Japanese Unexamined Patent Application Publication No. 2007-248087 (corresponding U.S. Pat. No. 8,019,161)

SUMMARY OF INVENTION

Technical Problem

In order to appropriately evaluate the deformation of a pattern that occurs owing to the optical proximity effect and the like, it is necessary to appropriately select and measure a position where the deformation occurs. In addition, in the case of obtaining a deviation between the edge obtained based on image pickup data and the edge of the reference pattern, it is desirable that the spacings between plural corresponding points should be measured, the statistical value of these plural measured results (for example, an average value) should be obtained, and this statistical value should be set as the deviation between the two edges. This is because it may become impossible to accurately perform the measurement owing to noise and the like if only one measurement value is used. Further, even in the case of selectively obtaining a measurement value of a certain portion, it is difficult to grasp a region to be measured in advance.

In other words, in order to appropriately evaluate a pattern, it is necessary that plural measurement positions should be set in appropriate measurement positions (area). Alternatively, it is necessary that the measurement positions should be set in appropriate positions based on the forming state of the pattern.

On the other hand, the above Patent Literatures disclose a technique in which a measurement value of each of regions of a pattern (such as corner portions or line ends of the pattern) is obtained by calculating an average of plural measurement values for each of regions. Since there may be different causes for deformations of the regions of a pattern, an appropriate measurement result based on each of the causes for the deformations of the pattern can be obtained using such a technique as above.

However, with advancing miniaturization of a pattern in these days, there often occurs a deformation of the pattern owing to plural causes. For example, in the case where there are two types of deformation owing to contraction and expansion in a pattern region which is a target of average calculation, if an average value of these measurement values is calculated, although there is a large deformation in reality, the measurement result for the contraction portion and the measurement result of the expansion portion cancel each other, which may induce a large deviance from an appropriate measurement result. In addition, there may be a case where expansion portions are different from each other in their levels owing to their different local occurrence causes. If only a technique, which is disclosed in the above Patent Literatures, and in which the measurement area of a pattern is divided into some specific regions of the pattern, is employed, there are some cases where an appropriate measurement result cannot be obtained.

A semiconductor measurement apparatus and a computer program, which attain an object to obtain a measurement result that appropriately reflects the deformation of a pattern even if plural causes exist together, will be explained hereinafter.

Solution to Problem

As an aspect of the present invention that attains the above object, a semiconductor measurement apparatus and a computer program are proposed in the following way. The semiconductor measurement apparatus and the computer program are capable of measuring the dimensions between plural measurement points of different positions of the edge of a reference pattern and plural corresponding points of the circuit pattern of an electronic device, in which the corresponding points correspond to the plural measurement points. In addition, the semiconductor measurement apparatus and the computer program are capable of measuring the spacings between the circuit pattern and the reference pattern, both of which exist in a predefined measurement area, selecting a second measured value aggregation from a first measured value aggregation comprised of measured values at plural points in the measurement area based on a predefined sampling condition, and calculating the measurement value based on the second measured value aggregation.

Advantageous Effects of Invention

According to the above configuration, a measurement result that appropriately reflects the deformation of a pattern can be obtained even if plural causes for the deformation of the pattern exist together.

BRIEF DESCRIPTION OF DRAWINGS

FIG. 1 is a flowchart showing the process of measuring the distance between a reference pattern and a measurement target pattern (circuit pattern).

FIG. 2 is a diagram showing the outline of a semiconductor measurement system.

FIG. 18 is a flowchart showing the process for judging the state of a pattern using a reference pattern to individual areas of which different pieces of identification information are added.

FIG. 19 is a diagram showing the outline of a technique in which pieces of identification information are added to the individual line segments of circuit data based on the detection of the correspondence between design data and the circuit data.

DESCRIPTION OF EMBODIMENTS

Figure 3:
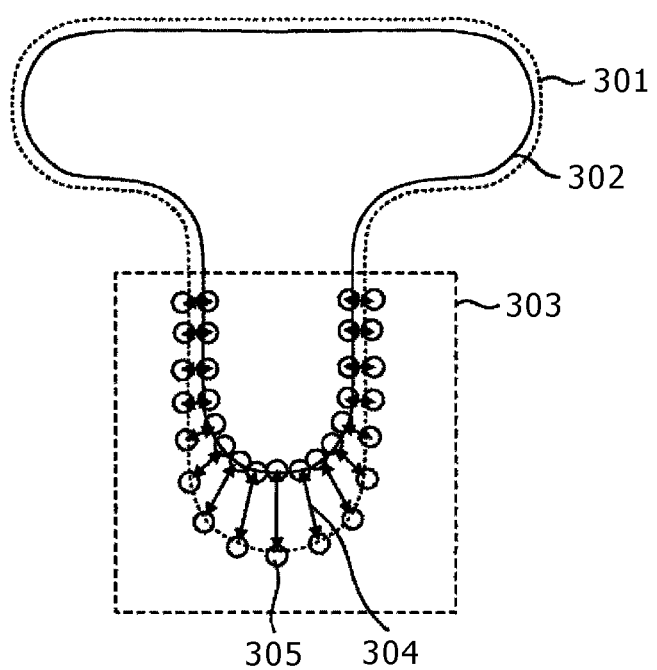
FIG. 3 is a diagram showing the measurement principle for measuring the distance between the reference pattern and the measurement target pattern.

Hereinafter, a semiconductor measurement apparatus and a computer program, which perform comparison and evaluate the deviation between a reference pattern and a pattern extracted from a picked-up image, will be explained.

In this embodiment, the comparison between a reference pattern and a pattern extracted from a picked-up image and the evaluation of the deviation between both patterns will be performed as follows. First, an inspection operator defines a circuit pattern of a preferable shape as a reference pattern. A graphic showing the contour line of a pattern formed based on design data, a circuit pattern created by simulating a circuit pattern to be actually manufactured, a golden pattern selected by the inspection operator out of already-manufactured circuit patterns, or the like is used as the reference pattern. Next, a circuit pattern is extracted from the photographed image using edge detection processing or the like. Subsequently, the reference pattern and the circuit pattern are superimposed on each other. The superimposition is executed by manual adjustment or by automatic adjustment using pattern matching.

Since the shape of a circuit pattern varies in many ways in accordance with the manufacturing condition or circuit layout of a semiconductor device, a measurement area is set in a two-dimensional area including inspection coordinates, and the distances between the edges of the reference pattern and the circuit pattern with each edge included in the measurement area are cyclopaedically measured at predefined intervals in order to accurately grasp the degree of the deformation of the shape of the circuit pattern. Next, the average of plural measured values obtained from the measurement area is calculated, and the result is set as the measurement value of the measurement area.

However, if the average value of plural measured values is set as the measurement value of the measurement area, information about a defect significantly small compared with the size of the measurement area is not reflected in the measurement value. Therefore, it may become difficult to judge whether there is a defect or not using the measurement value. Since it is difficult to accurately presume the occurrence state of a defect in advance, it is desirable that the size of the measurement area should be set substantially large. However, it becomes all the more difficult to accurately measure a defect or the deformation of a pattern that occur locally.

In this embodiment, a semiconductor measurement apparatus is capable of creating the measurement value of a circuit pattern of an electronic device by performing the comparison between the circuit pattern of the electronic device and a reference pattern. In addition, the semiconductor measurement apparatus is capable of measuring the spacings between the circuit pattern and the reference pattern, both of which exist in a predefined measurement area, selecting a second measured value aggregation from a first measured value aggregation comprised of measured values at plural points in the measurement area based on a predefined sampling condition, and calculating the measurement value based on the second measured value aggregation. In this embodiment, a system including the above semiconductor measurement apparatus, a computer program that makes a computer perform the above-described measurement, and a storage medium that stores the computer program are proposed as an aspect of the present invention for evaluating a defect and the deformation of a pattern.

Further, in the embodiment described hereinafter, an example, in which the measurement value and a predefined threshold are compared with each other and a defect of the circuit pattern is judged, will be explained.

In the embodiment described hereinafter, an example, in which the sampling condition is set based on data for limiting the number of the second measured value aggregations, will be also explained.

In the embodiment described hereinafter, an example, in which the sampling condition is set based on data used for prioritizing the measured values that are candidates of the second measured value aggregation using the relative comparison of the first measured value aggregation, will be also explained.

In the embodiment described hereinafter, an example, in which the sampling condition is set based on measurement directions used for the creation of the measurement value, will be also explained.

In the embodiment described hereinafter, an example, in which the sampling condition is set based on data used for cyclopaedically selecting measured values of a circuit pattern out of a first measured value aggregation, will be also described.

In the embodiment described hereinafter, an example, in which the sampling condition is set based on data used for specifying a kind of circuit pattern, will be also described.

In the embodiment described hereinafter, an example, in which the sampling condition is set based on data used for specifying measured values using measured values of an expansion region of the circuit pattern relative to the reference patter, using measured values of a contraction region of the circuit pattern relative to the reference patter, or using the magnitude relation between the measured values of the expansion region and the measured values of the contraction region, will be also explained.

In the embodiment described hereinafter, a semiconductor measurement apparatus including a scanning electron microscope that forms image data based on electrons obtained by scanning electron beams on an electronic device will be also explained.

In the embodiment described hereinafter, a semiconductor measurement apparatus including a display device having a screen on which the measurement value and the result of defect judgment are displayed will be also explained.

In addition, an example, in which the measurement value and the result of defect judgment are displayed on the display device, will be explained.

Further, a display device into which one datum or more can be input from the screen will be explained.

A semiconductor measurement system including a display device, into which one datum or more regarding the above-described sampling condition are input, will be also explained.

In addition to the above explanations, an example, in which measurement results, which are used for the dimension measurement between the edge of a reference pattern and the edge of a pattern extracted from a picked-up image, are selected, or positions, about which the measurement should be newly performed, are selected based on the measurement results at different plural positions between both edges, and the deviation between both edges is calculated based on the selected measurement results or measurement results at the newly selected measurement positions, will be explained.

By measuring the spacings between the circuit pattern and the reference pattern, both of which exist in a predefined measurement area, selecting a second measured value aggregation from a first measured value aggregation comprised of measured values at plural points in the measurement area based on a predefined sampling condition, and calculating the measurement value based on the second measured value aggregation, it becomes possible to obtain the measurement value which accurately reflects an abnormality or a defect of the circuit pattern without depending on the size of the measurement area.

Hereinafter, a semiconductor measurement apparatus and a computer program that compare a reference pattern and a pattern extracted from a picked-up image with each other, or evaluate a deviation between both patterns with reference to drawings.

FIG. 2 is the schematic block diagram of a semiconductor measurement system. The semiconductor measurement system includes a scanning electron microscope 201 (abbreviated to the SEM 201 hereinafter) that obtains the image data of a circuit pattern and a control device 220 for inspecting the circuit pattern by analyzing image data.

In the SEM 201, electron beams 202 are irradiated to a sample 203 such as a wafer on which an electronic device is fabricated, electrons emitted from the sample 203 are captured by a secondary electron detector 204 or reflection electron detectors 205 and 206, and these electrons are converted into digital signals by an A/D converter 207. The digital signals are input into the control device 220, and stored in a memory 208. A CPU 209 or an image processing hardware 210 such as an ASIC or an FPGA executes image processing on the digital signals in accordance with the aim of the processing, and the circuit pattern is inspected.

In addition, the control device (calculation device) 220 is coupled to a display 211 having an input means, and has a function of a GUI (graphical user interface) or the like for displaying images and inspection results toward a user. Here, a part or the entirety of the control performed by the control device 220 may be allocated to an electronic computer or the like including a CPU and a memory capable of storing images, and may be processed or controlled by the electronic computer. Further, the control device 220 is coupled to an imaging recipe creation device 212 via a network, a bus, or the like, in which the imaging recipe creation device 212 creates an image pickup recipe, which includes the coordinates of electronic devices necessary for inspection, templates for pattern matching used for determining inspection positions, photographing conditions, and the like, by hand or using the design data 213 of the electronic devices.

Figure 8:
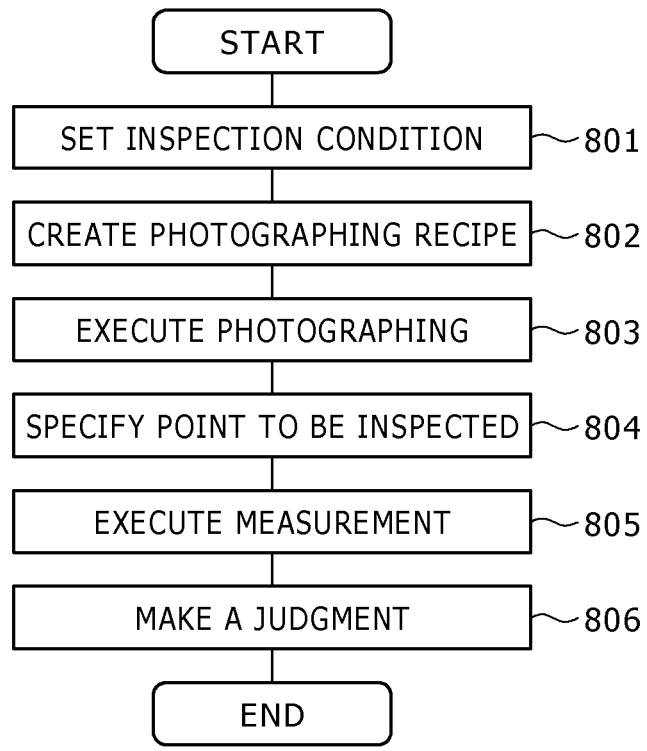
FIG. 8 is a flowchart showing the measurement process of a semiconductor device.

FIG. 8 is a flowchart showing the measurement process of a semiconductor pattern. First, an operator sets an inspection (measurement) condition using the imaging recipe creation device 212 (at step 801). The inspection condition includes the photographing magnification of the SEM 201, the coordinates of a circuit pattern (referred to as the inspection coordinates hereinafter), a measurement area, an inspection method (including an after-mentioned inspection procedure and measurement of dimensions), parameters necessary for inspection, and the like. In other words, the inspection condition is information used for obtaining the photographed image of the circuit pattern to be inspected using the SEM 201 and inspecting the photographed image. The inspection coordinates includes the coordinates of a reticle or a wafer which is obtained by an optical simulation and in which the occurrence of a defect is expected, or the coordinates of a reticle or a wafer in which the occurrence of a defect is recognized by an appearance inspection device or the like. Such inspection coordinates are supplied to the imaging recipe creation device 212 from a device 214 (EDA system) that predicts a defect using an optical simulation, a wafer appearance inspection device 215, or the like. The measurement area is coordinate information of a two-dimensional area set so as to surround the inspection coordinates, and it is determined by an inspection operator.

Next, the photographing recipe is created (at step 802). The photographing recipe is a collection of data for controlling the SEM 201, and includes an inspection condition set by the inspection operator or the like, and a template for specifying inspection points using the photographed image.

Subsequently, the circuit pattern is photographed based on the recipe by the SEM 201 (at step 803). After pattern matching is executed, the inspection points within the photographed image are specified (at step 804). Next, measurement is performed using an after-mentioned procedure (at step 805). Lastly, it is judged whether the circuit pattern is good or bad using the measurement value (at step 806). The judgment whether the circuit pattern is good or bad is performed by comparing the measurement value obtained by the inspection according to the present invention with a predefined threshold set by the inspection operator.

Figure 11:
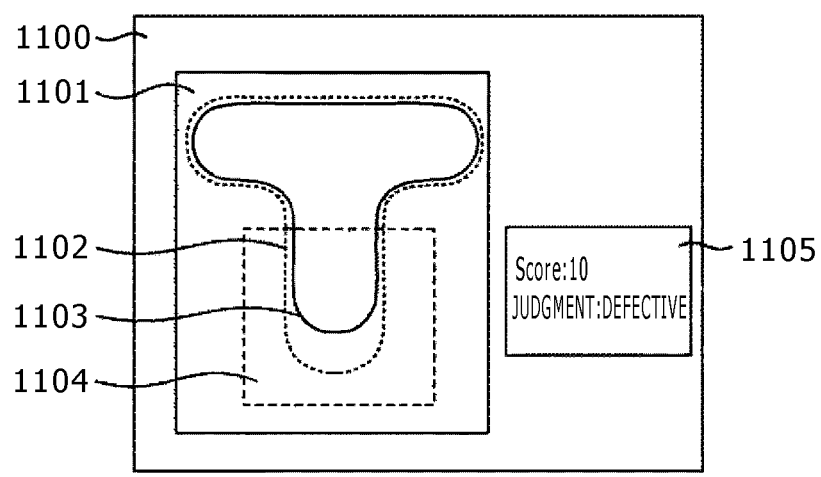
FIG. 11 is a diagram showing a display screen for a measurement result.

FIG. 11 shows a GUI screen 1100 displaying an inspection result. This GUI screen 1100 is displayed on the screen of the display 211, on the display of the imaging recipe creation device 212, or on the screen of the electronic computer, which includes a CPU, to which a part or the entirety of the control performed by the control device 220 is allocated, and a memory capable of storing images, using a GUI program. The GUI program is stored in the memory of the semiconductor measurement apparatus, and is executed through processing by the CPU of the semiconductor measurement apparatus.

The semiconductor measurement apparatus displays a reference pattern 1102, a circuit pattern 1103, and a measurement area 1104 on the circuit pattern display window 1101 of the GUI screen 1100 based on the inspection result. In addition, the measurement value and the judgment result are displayed on an inspection result display window 1105.

A more detailed measurement procedure of a circuit pattern will be explained with reference to FIG. 1 and FIG. 3. FIG. 1 is a flowchart showing the measurement procedure. First, a reference pattern is superimposed on a circuit pattern (at step 101). A reference pattern is a circuit pattern whose shape is a manufacturing target. For example, a circuit pattern formed based on design data, a circuit pattern created by simulating a circuit pattern to be actually manufactured, or a golden pattern selected by the inspection operator out of already-manufactured circuit patterns is used as the reference pattern. It will be assumed that reference patterns are stored in the photographing recipe or in the memory installed in the semiconductor measurement apparatus. In order to compare a reference pattern and a circuit pattern included in a photographed image with each other, the circuit pattern is superimposed on the reference pattern. FIG. 3 shows the result obtained by superimposing a circuit pattern 302 on a reference pattern 301. The position of the reference pattern 301 on which the circuit pattern 302 is superimposed is determined using the result of pattern matching executed in an earlier stage of an inspection.

Next, the distances 304 between the reference pattern 301 and the circuit pattern 302 both located in a measurement area 303 are measured (at step 102). In order to accurately capture various pattern deformations, measurement points 305 are set at intervals of a pixel or at intervals of a sub-pixel on the reference pattern (or on the circuit pattern), and spacings between the reference pattern and the circuit pattern are cyclopaedically measured.

The pattern matching, measurement processing, and the like as described above can be executed by pieces of dedicated hardware, or can be executed by making a general-purpose computer execute processing as described above or as described later.

Here, the measurement points 305 are set at predefined intervals or at arbitrary intervals, and measurement directions are set as predefined directions from the measurement points 305 (for example, to constant directions, to directions allocated to individual regions of the pattern, to directions perpendicular to the edge of the reference pattern 301, or the like), or the measurement directions are set as directions to points on the circuit pattern 302 that are nearest to the measurement points 305, or set as directions to points on the circuit pattern 302 that are nearest to the measurement points 305 in which the points on the circuit pattern 302 are selected in such a way that a line between each of the measurement points 305 and the corresponding point on the circuit pattern 302 does not intersect with other lines. In addition, it is not always necessary to determine the measurement directions as described above, and it is conceivable that the measurement directions are determined in accordance with a predefined condition different from the above. The determination of the measurement directions can be automatically set in accordance with the above-described condition or the like.

Here, since one of objects of the measurement of distances between the reference pattern and the circuit pattern is to obtain the shape difference between both patterns, it is preferable to obtain distances between corresponding points before a deformation and distances after the deformation. Therefore, it is desired that the measurement directions should be set so that points on the circuit pattern 302 which are nearest to the measurement points 305 provided for the reference pattern 301 are set as corresponding points. However, lest erroneous corresponding points should be detected owing to an unexpected deformation of the circuit pattern or the influence of noise, it is conceivable that the measurement directions are set under a predefined constraint (for example, the measurement directions are set within a predefined angular range).

Next, a second measured value aggregation, which is used for creating a measurement value, is selected from a first measured value aggregation obtained by measuring distances at plural positions in the measurement area 303 based on an after-mentioned sampling condition (at step 103). The sampling condition can be registered in the photographing recipe by an inspection operator as an inspection parameter or can be an inspection parameter that is designated at the time of measurement sampling.

Sampling methods based on various sampling conditions will be described with reference to FIG. 4. Here, it will be assumed that a sampling method can be specified as an inspection parameter.

(1) Sampling Based on the Magnitudes of Measured Values

In this sampling, a sampling number, priority information about measured values, and a noise judgment threshold are used as inspection parameters of a sampling condition.

Figure 4:
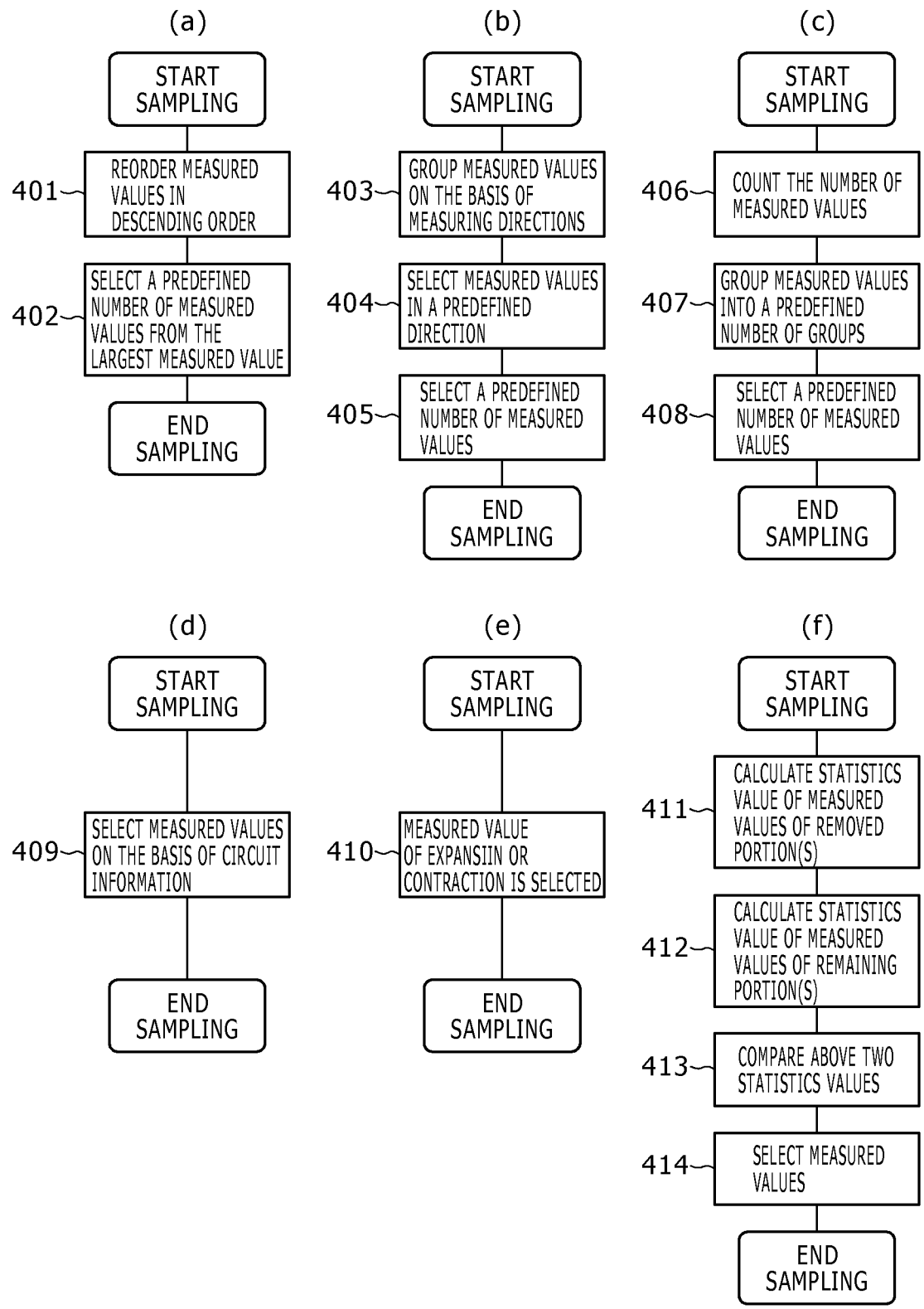
FIG. 4 shows flowcharts showing the process of selectively sampling measurement points each having a predefined condition.
Figure 5:
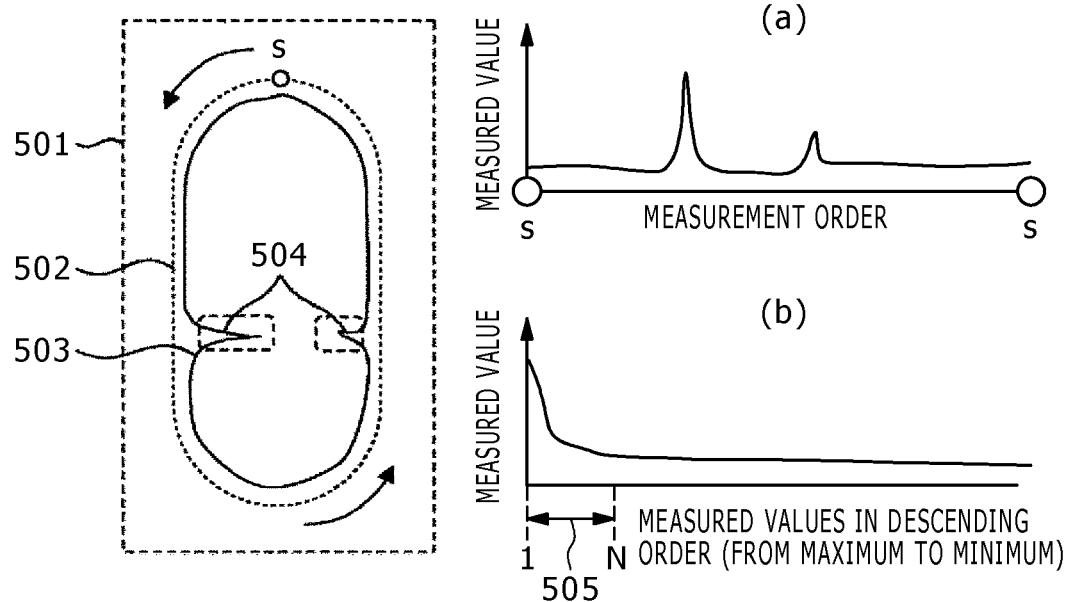
FIG. 5 is a diagram showing an outline of measurement point sampling (No. 1).

FIG. 4(*a*) shows a procedure in which the individual measured values of a first measured value aggregation are compared with each other, and a predefined number of measured values, which are used for forming a second measured value aggregation, are selected based on their magnitude relation. FIG. 5 shows an example of a measurement area 501, an example of a reference pattern 502, and an example of a circuit pattern 503. A part of the circuit pattern includes small defects 504. The distances between the reference pattern 402 and the circuit pattern 403 are measured anticlockwise from the point s shown in the measurement area 501, and these measured values are graphed as shown in FIG. 5(a). These measured values form the first measured value aggregation.

In order to reflect measured values having partial defects, which exist in the first measured value aggregation, in a measurement value, the measured values of the first measured value aggregation are compared with each other as shown in FIG. 5(a) first, and data is created by reordering the measured values of the first measured value aggregation in descending order as shown in FIG. 5(b) (at step 401). This reordering priority is set as an inspection parameter (priority information about measured values). Next, the second measured value aggregation is created based on the sampling number set as an inspection parameter (at step 402).

As described above, by sampling using information about the magnitudes of the measured values (one of pieces of dimension value information that satisfy a predefined condition), even if, for example, a measurement area is set so that the measurement area surrounds the entirety of the circuit pattern, or measurement areas are set so that the measurement areas surround only defects 504, almost the same result can be calculated as a measurement value. Here, in the case where a large amount of noise is included in the measured values, it is conceivable that, after the measured values of the first measured value aggregation are reordered in descending order, M measured values from the largest measured value are omitted (where M represents the number of measured values and M is an inspection parameter used as a noise judgment threshold), and measured values that form the second measured value aggregation are selected.

(2) Sampling Based on Measurement Directions

In this sampling, a sampling number, priority information about measured values, and measurement direction information are used as inspection parameters of sampling condition.

Figure 6:
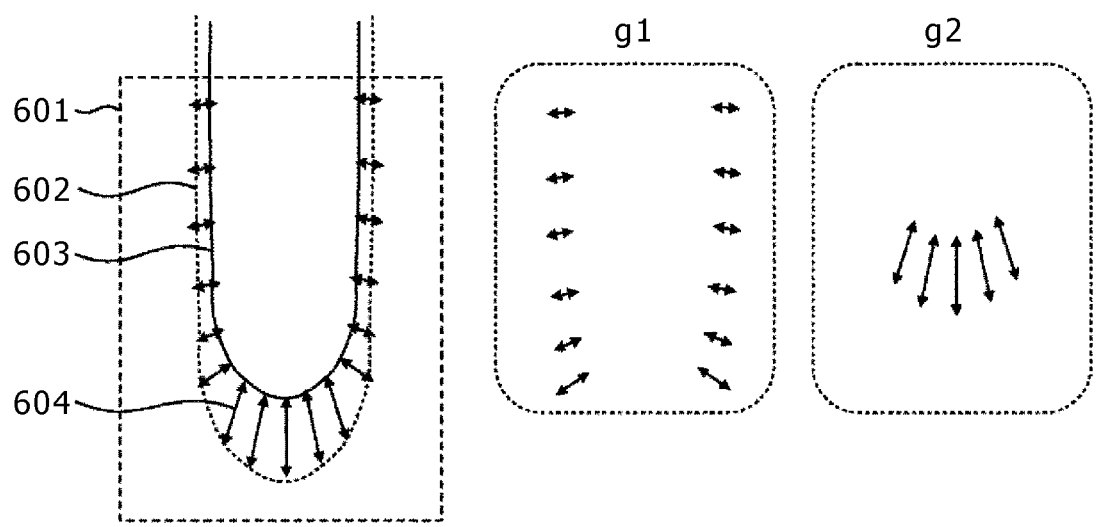
FIG. 6 is a diagram showing an outline of measurement point sampling (No. 2).

FIG. 4(b) shows a procedure in which a predefined number of measured values, which form the second measured value aggregation, are selected out of the first measured value aggregation based on measurement directions of the reference pattern and the circuit pattern used for calculating individual measured values. FIG. 6 shows an example including a measurement area 601, a reference pattern 602, and a circuit pattern 603 of a wiring terminal. A setback defect occurs often in a wiring terminal. Therefore, the setback amount of the line end can be accurately converted into a numeric value by reflecting measured values, which are obtained by measuring distances between the reference pattern 602 and the circuit pattern 603 in the setback direction of the line end, in a measurement value. In the example shown in FIG. 6, since the setback direction of the line end is a longitudinal direction, not a gathering g1 of values measured in the direction of 0+/−α degree (where α can be any number) as shown in FIG. 6(b), but a gathering g2 of values measured in the direction of 90+/−α degree (where α can be any number) is set as a target from which the measurement value is created. First, in such a way, groups are made in accordance with the measurement directions out of the first measured aggregation (at step 403). As described above, the dimension values are classified in accordance with the measurement directions that vary depending on the positions of corresponding points on the circuit pattern. In other words, the dimension values are classified in accordance with the types of measured value (in this example, the type of measured value is a direction).

Next, the group of measured values corresponding to a measurement direction set as an inspection parameter is selected (at step 404). Subsequently, a sampling number of measured values are selected, for example, in descending order of the measured values based on the sampling number set as an inspection parameter, and a second measured value aggregation is created using the selected measured values (at step 405). Owing to the above-described procedure, if the occurrence direction of a defect, which may occur in the circuit pattern to be inspected, is predictable, the accurate state of the defect can be calculated as a measurement value by sampling the measured values using the measurement direction information. In addition, although the sampling number is used for constraining the number of measurement points in the above explanation, a piece of information set as the inspection parameter can be the length or area of a circuit pattern, or the like as long as it can be used for constraining the number of measurement points.

As described above, the dimension values are classified in accordance with the measurement directions that vary depending on the positions of corresponding points on the circuit pattern. In other words, if the dimension values are classified in accordance with the types of measured value (in this example, the type is a direction), a deviation having a specific tendency can be selectively extracted.

(3) Sampling Based on the Intervals of Measurement Points

In this sampling, a sampling number that is used for determining sampling intervals, priority information about measured values, and information about the number of measurements are used as inspection parameters of sampling condition.

Figure 7:
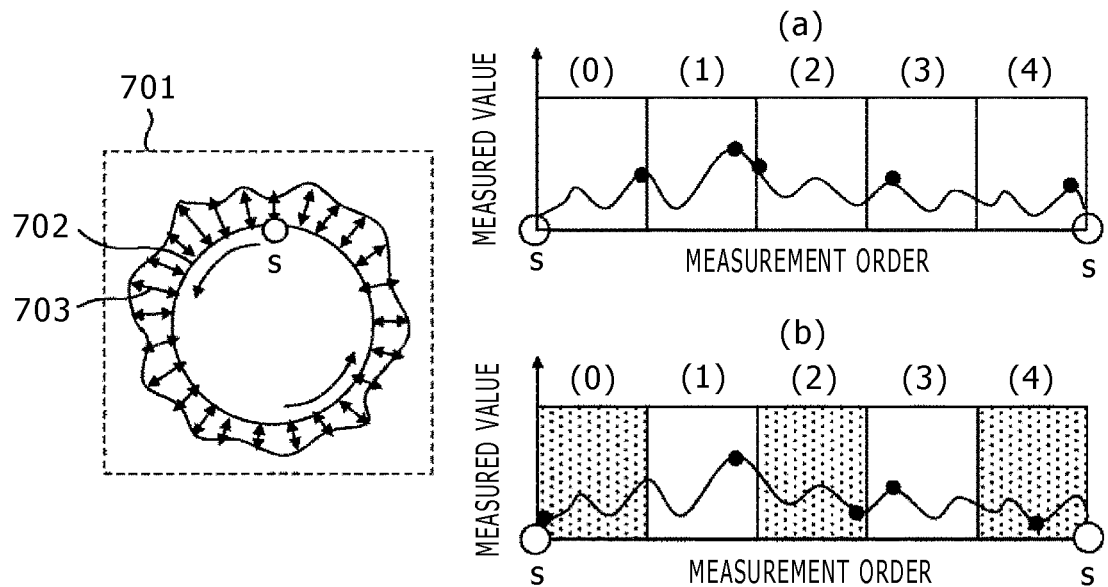
FIG. 7 is a diagram showing an outline of measurement point sampling (No. 3).

FIG. 4(c) shows a procedure in which a predefined number of measured values, which form the second measured value aggregation, are selected out of the first measured value aggregation based on the number of the first measured value aggregations and the measurement order. FIG. 7 shows an example including a measurement area 701, a reference pattern 702, and a circuit pattern 703 of a hole. As for a hole pattern, since it is desired that the contraction or deformation of the entirety of the shape should be inspected, a measurement value is created by evenly using measured values around the entire periphery of the hole. Therefore, the number of measurement points is counted anticlockwise from a measurement point s shown in the measurement area 701 in FIG. 7 to the measurement point s (at step 406). Here, FIG. 7(a) and FIG. 7(b) show graphed measured values obtained at the measurement points in anticlockwise order from the measurement point s to the measurement point s.

The measured values are grouped based on the sampling number and the measurement point number both set as inspection parameters (at step 407). For example, if the measurement values of the hole pattern shown in FIG. 7 are created at sampling points the number of which is five, the number of the first measurement point aggregation is divided into five parts, and five groups are determined. Signs (0) to (4) in FIG. 7(a) represent the grouped first measurement point aggregation. Next, a second measured value aggregation is created by selecting, for example, the largest measured value out of each group (at step 408). By executing sampling with the use of information about the number of measurement operations and information about the measurement order, the measurement value that evenly uses all the measured values in the measurement area can be created.

In addition, as shown in FIG. 7(b), it is also conceivable that the smallest measured value in each of groups represented by signs (0), (2), and (4) is selected, and the largest measured value in each of groups represented by signs (1), and (3) is selected. For example, when the deformation of the hole pattern is inspected, the standard deviation of the second measured value aggregation obtained in this procedure is set as a measurement value. Owing to the above-described procedure, the measurement value can be created using effective information for evaluation of deformation included in the first measured value aggregation.

(4) Sampling Based on the Types of Circuit Pattern

FIG. 4(d) shows a procedure in which a predefined number of measured values, which form the second measured value aggregation, are selected out of the first measured value aggregation based on the types of circuit pattern to be measured. As is the case with the above-described sampling condition (2) or (3), if information about a circuit pattern to be inspected is given, and the type of circuit pattern is set as an inspection parameter, the above-described sampling (2) is executed in the case of a wiring terminal, and the above-described sampling (3) is executed in the case of a hole. Subsequently, a second measured value aggregation is created for each of the above two cases (at step 409). Owing to the above-described procedure, the measurement value based on a condition appropriate for a circuit pattern can be created.

Figure 12:
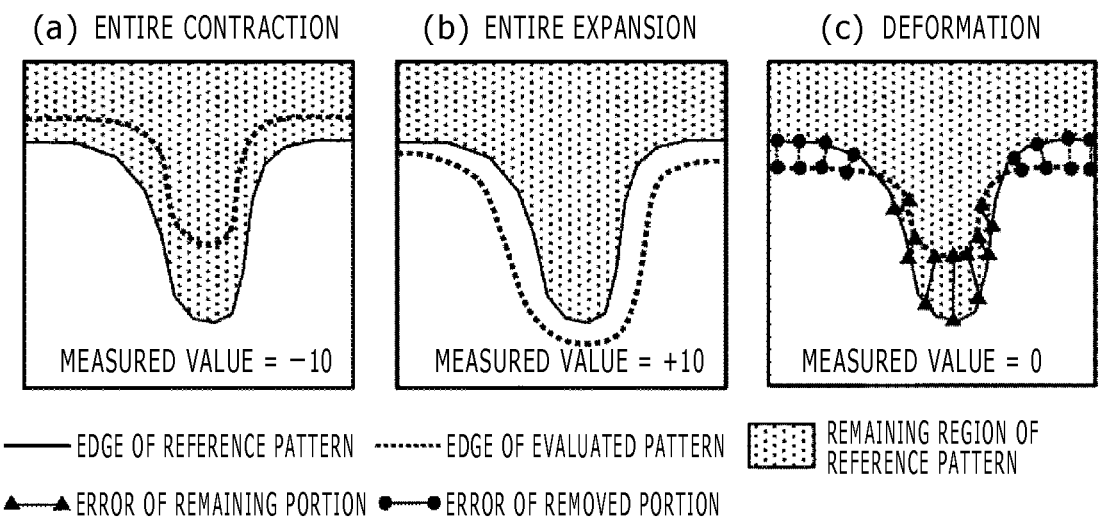
FIG. 12 is a diagram showing examples in which different pieces of identification information are added to measured results in accordance with the shapes of evaluated patterns (circuit patterns).

(5) Sampling Based on Information about the Contraction, Expansion, and Entire Deformation of a Circuit Pattern In this sampling, pieces of information about the contraction, expansion, and entire deformation of a circuit pattern are used as inspection parameters of sampling condition. Since a circuit pattern varies so much in accordance with variations of manufacturing condition as to show contraction (in FIG. 12(a)), expansion (in FIG. 12(b), or deformation (in FIG. 12(c)) as shown in FIG. 12, it is desired to create a measurement value capable of distinguish these states. Therefore, when errors between a reference pattern and the circuit pattern are measured, pieces of identification information in the case of a measurement region exists in the removed portion of the reference pattern and in the case of a measurement region exists in the remaining portion of the reference pattern are different from each other as shown in FIG. 12(c), and these pieces of information are added to measured values, so that a first measured value aggregation is created.

Next, identification information is referred to at the time of sampling a second measured value aggregation, and the second measured value aggregation is determined in accordance with the inspection parameter (the amount of contraction, the amount of expansion, or the amount of entire deformation). To put it concretely, as shown in FIG. 4(e), when the second measured value aggregation is obtained by sampling the first measured value aggregation, the identification information is referred to, and if the amount of contraction is designated as an inspection parameter, a measured value aggregation measured in a remaining portion is selected as the second measured value aggregation. In addition, if the amount of expansion is designated as an inspection parameter, a measured value aggregation measured in a removed portion is selected as the second measured value aggregation. Further, if the amount of entire deformation is designated as an inspection parameter, the second measured value aggregation is selected as shown in FIG. 4(f). First, the average value of the measured value aggregation measured in the removed portion is calculated (at step 411). Next, the average value of the measured value aggregation measured in the remaining portion is calculated (at step 412). Subsequently, the average value in the removed portion and the average value in the remaining portion are compared with each other (at step 413), and a larger measured value aggregation is selected as the second measured value aggregation (at step 414). Owing to the above-described procedure, the measurement value obtained by giving emphasis to the variation amount of a region having a larger deformation can be created even if an expansion region and a contraction region exist together in a measurement area as shown in FIG. 12(c). Since the region having the larger average value can be regarded as a defect of a typical level in the area, the most essential defect can be identified regardless of other variation causes. As described above, by comparing a statistical value of measured values inside a pattern and a statistical value of measured values outside the pattern, and setting the larger one as a measured value, it becomes possible to selectively detect the most remarkable deviation out of co-existing plural causes for the deformation. In addition, in the above statistical calculation, not only simple arithmetic averaging but also other statistical calculations such as weighted averaging can be adopted if necessary.

Figure 15:
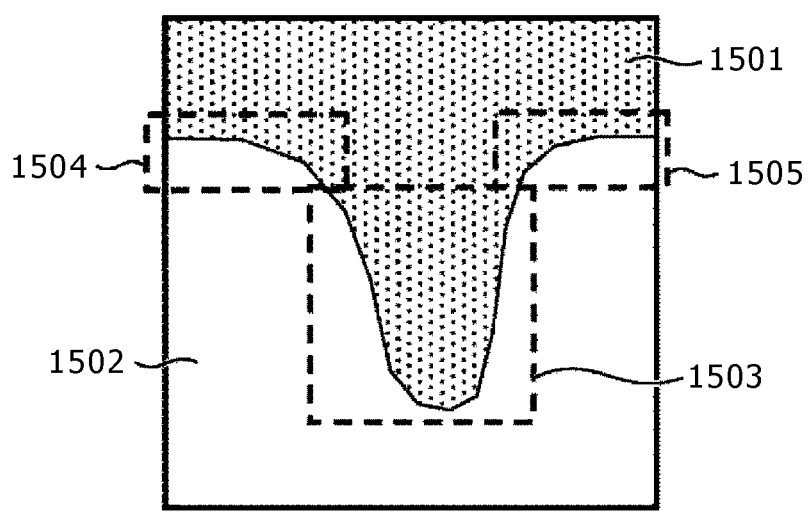
FIG. 15 is a diagram showing an example in which different pieces of identification information are added to individual areas of reference pattern data.

Here, in order to judge whether a corresponding point on a circuit pattern, which corresponds a point of a reference pattern, belongs to the removed portion (outside of the edge of the reference pattern) or belongs to the remaining portion (inside of the reference pattern), it is conceivable that, for example, each area of the reference pattern as shown in FIG. 15 is given an attribute datum, and after the reference pattern is superimposed on the circuit pattern, the attribute datum of each area, in which the corresponding point on the circuit pattern is located, is referred to, and the attribute datum is added to a measured result. In the example shown in FIG. 15, an area 1501 is given an attribute datum showing that the area 1501 is inside the pattern, and an area 1502 is given an attribute datum showing that the area 1502 is outside the pattern. As described above, if attribute data are given to reference pattern data in advance, it becomes easier to classify measurement results.

In addition, identification information is added to each of the line segments of the reference pattern in reference pattern data illustrated in FIG. 15. To put it concretely, an attribute data area 1503 in a convex portion, and an attribute data areas 1504 and 1505 in flat portions are added to the reference pattern data. As described above, by allowing reference pattern data to additionally have segment information and information about the inside or outside of a pattern, more detailed classification of measurement results can be executed.

By stacking plural attribute data in such a way, and by making measurement results identifiable, it becomes possible to accurately specify the meanings possessed by those measurement results. For example, if an algorism, which performs a judgment that there is a defect when the measurement results of the deviation of a certain combination (for example, a combination of corresponding points that exist in the inside of a pattern in a convex portion) become larger than a predefined value, is configured, it becomes possible to selectively extract a target that can be empirically judged defective.

In addition, in the case where the measurement results at measurement points belonging to the attribute data areas 1504 and 1505 in the flat portions are larger than a predefined value in the direction toward the inside of the reference pattern, and the measurement results at measurement points belonging to the attribute data area 1503 in the convex portion are larger than a predefined value in the direction toward the outside of the pattern, although the entirety of the circuit pattern is in a state of contraction, it can be said that only an action to protrude the convex portion remarkably functions. When such a combination as above is detected, desired measurement results can be effectively selected by installing an algorism configured to add identification information different from information about a defect or other measurement results.

Here, as attribute data added to the line segments of a reference pattern, design data of a semiconductor pattern (for example, GDS data) can be used. Since the design data includes identification information for each of line segments forming, for example, a closed graphic, the identification information can be added to the line segments of the contour line by detecting the correspondence to the contour. FIG. 19 is a diagram showing an example, and it shows that corresponding points between an edge 1901 based on the design data and a contour line 1902 are detected by executing pattern matching between the edge 1901 and the contour line 1902. By detecting the corresponding points in such a way, identification information possessed by the edge 1291 based on the design data (in FIG. 19, the identification information includes pieces of line segment information L1 to L6) is added to the contour line 1902. For example, identification information L2 is added to corresponding points included in an area 1903, and identification information L5 is added to corresponding points included in an area 1903. In addition, the identification information can be identification information per line segment, or can be something like position information that indicates the position of each line segment such as "Top", "Right", "Left", or "Bottom".

Lastly, a measurement value is created from the second measured value aggregation selected by sampling (at step 104). Here, if there are two second measured value aggregations or more, the measurement value is created by statistical calculation processing such as calculation of an average or a standard deviation, but the creation processing of the measurement value is not limited to the above pieces of calculation processing.

Figure 13:
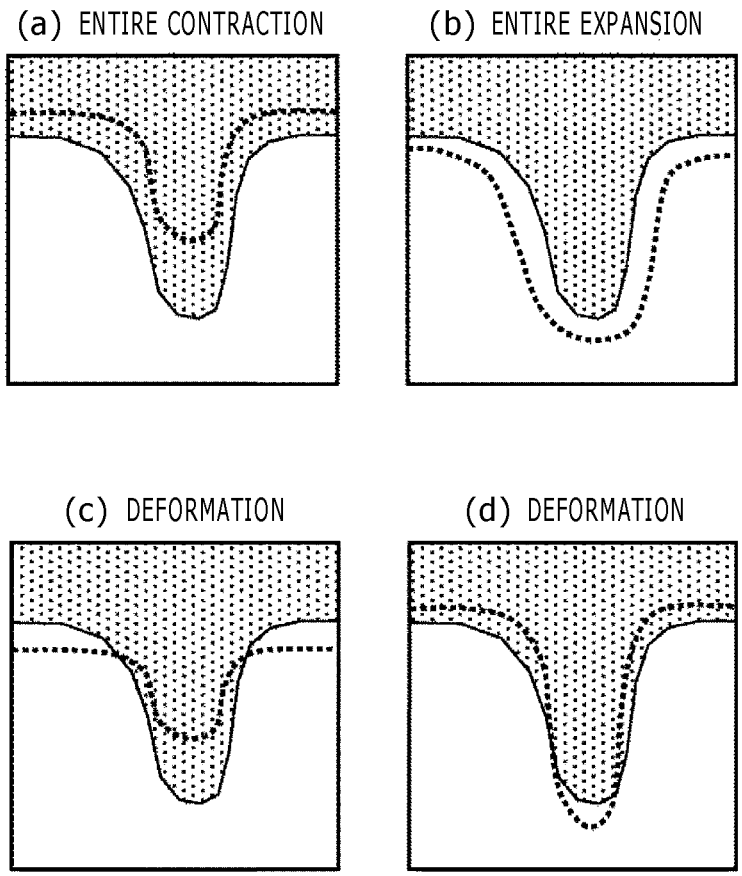
FIG. 13 is a diagram showing some types of defect.

In addition, it is also conceivable that the type of a defect is identified based on the output of a measurement value. For example, as illustrated in FIG. 13, the types of deformation of a convex pattern can be classified roughly into four types as shown in FIG. 13(a) to FIG. 13(d). Particularly, a deformation shown by FIG. 13(c) can be defined as "contracted convex portion and expanded peripheral portion", and a deformation shown by FIG. 13(d) can be defined as "expanded convex portion and contracted peripheral portion". By making a database of the relations between types of defect and measurement values, classifying defects based on the database, storing the defects as well as the above-described "measurement values obtained by giving emphasis to the variation amounts of regions having larger deformations" as measurement values, and enabling the results to be displayed, it becomes possible to grasp meanings possessed by output measurement results more accurately.

Figure 10:
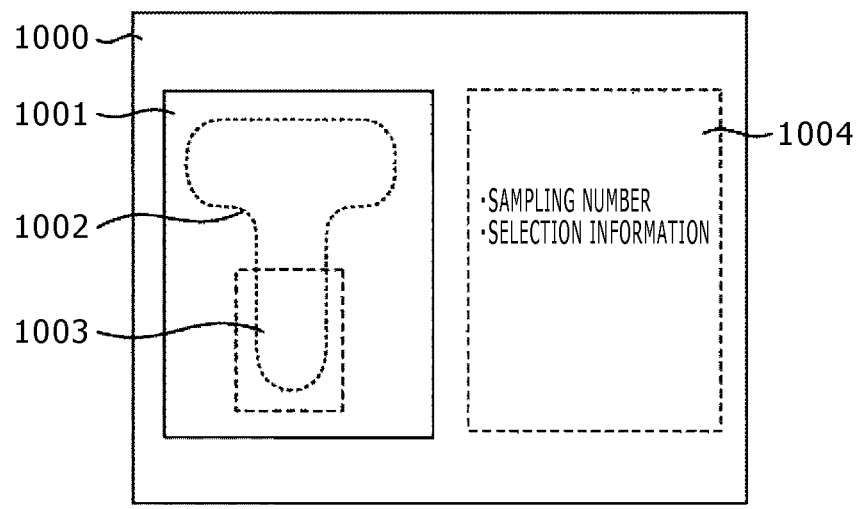
FIG. 10 is a diagram showing a setting screen for measurement parameters.

FIG. 10 shows a GUI screen 1000 used for setting a sampling condition. This GUI screen 1100 is displayed on the screen of the display 211, on the display of the imaging recipe creation device 212, or on the screen of the electronic computer, which includes a CPU, to which a part or the entirety of the control performed by the control device 220 is allocated, and a memory capable of storing images, using a GUI program. The GUI program is stored in the memory of the semiconductor measurement apparatus, and is executed by the processing of the CPU of the semiconductor measurement apparatus.

Figure 9:
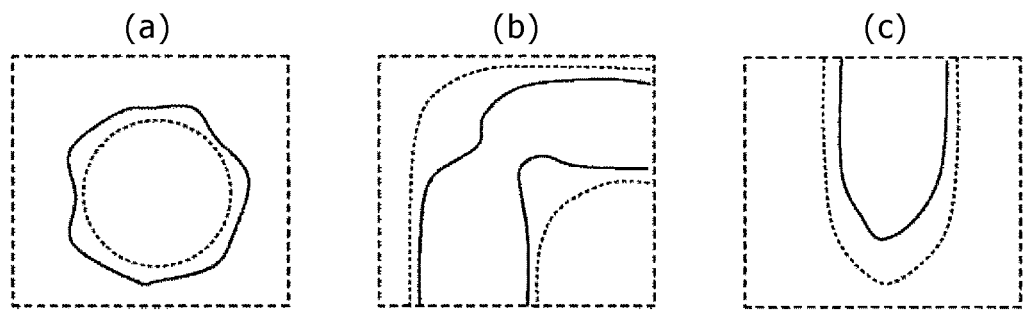
FIG. 9 is a diagram showing some types of circuit pattern.

The semiconductor measurement apparatus displays a reference pattern 1002 on a reference pattern display window 1001 of the GUI screen 1000 in accordance with instructions issued from an inspection operator. A part (or parts) of the reference pattern to be displayed can be a part at one inspection point, or parts at plural inspection points as shown in FIG. 9(a), FIG. 9(b), or FIG. 9(c). Next, either for one inspection point, or for plural inspection points, a measurement area 1003 and inspection parameters necessary for the above-mentioned sampling (a sampling number, a method for selecting sampling points) are input into an inspection parameter setting window 1004. The semiconductor measurement apparatus performs semiconductor measurement using the input measurement area and the inspection parameters.

FIG. 18 is a flowchart showing an example of a measurement process. First, the control device 220 controls the SEM 201 in accordance with a recipe created by the imaging recipe creation device 212 so that an image in a desired position is obtained (at step 1801). Next, the contour line of a circuit pattern is extracted from the image, and by detecting the correspondence between each line segment of the contour line and design data if necessary, identification information is added to each line segment of the contour line (at step 1802). Subsequently, pattern matching between the circuit pattern and a reference pattern is executed (at step 1803). Subsequently, corresponding points that correspond to preset measurement points on the reference pattern are detected on the circuit pattern (at step 1804).

Here, information about an area in which each corresponding point is located (for example, information about whether each corresponding point is located inside the pattern or outside the pattern) is added to each corresponding point, and at the same time, distances between the corresponding points and the measurement points are measured (at step 1805). Lastly, the state of the pattern is judged based on the measurement results and attribute information about the corresponding points (at step 1806). When a combination of desired pieces of information is detected, the judgment is performed based on an algorithm in which the state of the pattern is selected as a defect or a reevaluation point. Finally, these pieces of information are registered (at step 1807).

According to such a process, even a pattern deformation brought about by plural causes can be appropriately evaluated.

According to the above-described embodiment, using a means for measuring the spacings between the circuit pattern and the reference pattern in which both patterns exist in a predefined measurement area, a means for selecting a second measured value aggregation from a first measured value aggregation comprised of measured values at plural points in the measurement area based on a predefined sampling condition, and a means for calculating the measurement value based on the second measured value aggregation, it becomes possible to obtain the measurement value which accurately reflects an abnormality and a defect of the circuit pattern without depending on the size of the measurement area.

Figure 14:
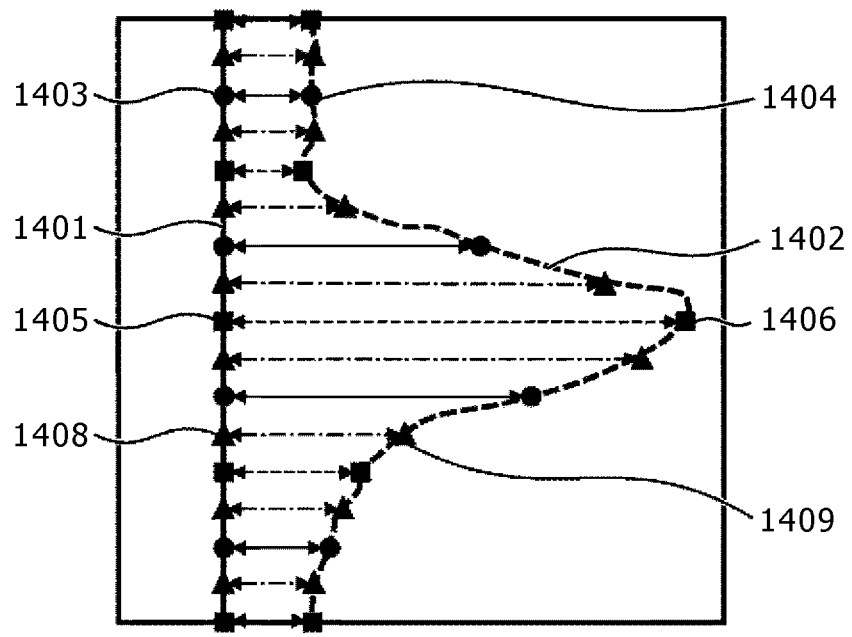
FIG. 14 is a diagram showing an example in which plural measurement points are set between a reference pattern and a circuit pattern.

Next, another example in which a second measured value aggregation is selected based on a first measured value aggregation. FIG. 14 is a diagram for identifying a defect based on the measurement of a deformation between the edge 1401 of a reference pattern and the edge 1402 of a circuit pattern. In an example shown in FIG. 14, plural measurement points 1403, 1405, and 1408 are set on the edge 1401 of a reference pattern, and corresponding points 1404, 1406, and 1409, which are in the perpendicular direction to the edge 1401 of the reference pattern and correspond to the plural measurement points, are set on the edge 1402 of a circuit pattern.

Figure 16:
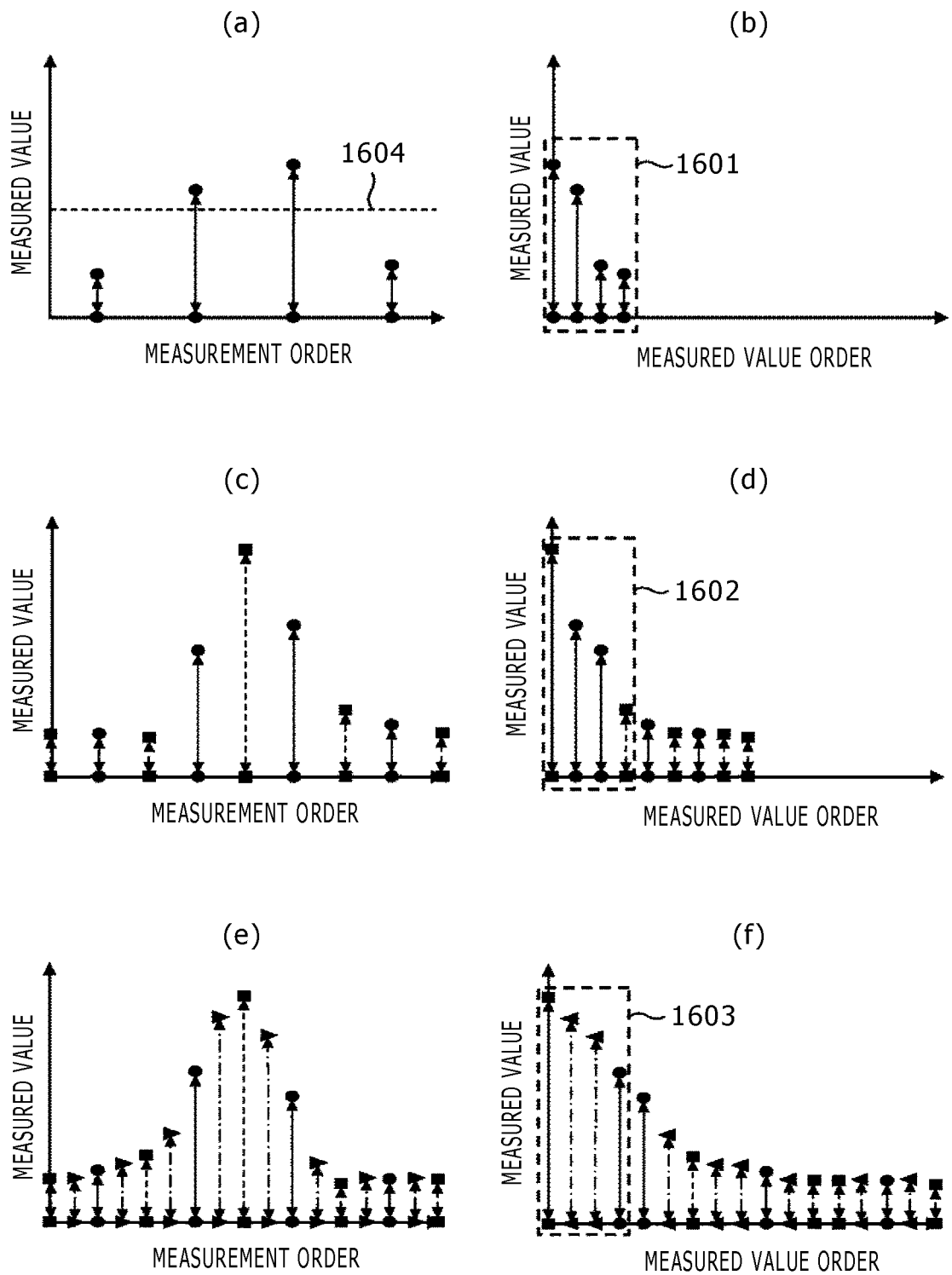
FIG. 16 is a diagram showing a list of measured results obtained by making measurements at different sampling rates.
Figure 17:
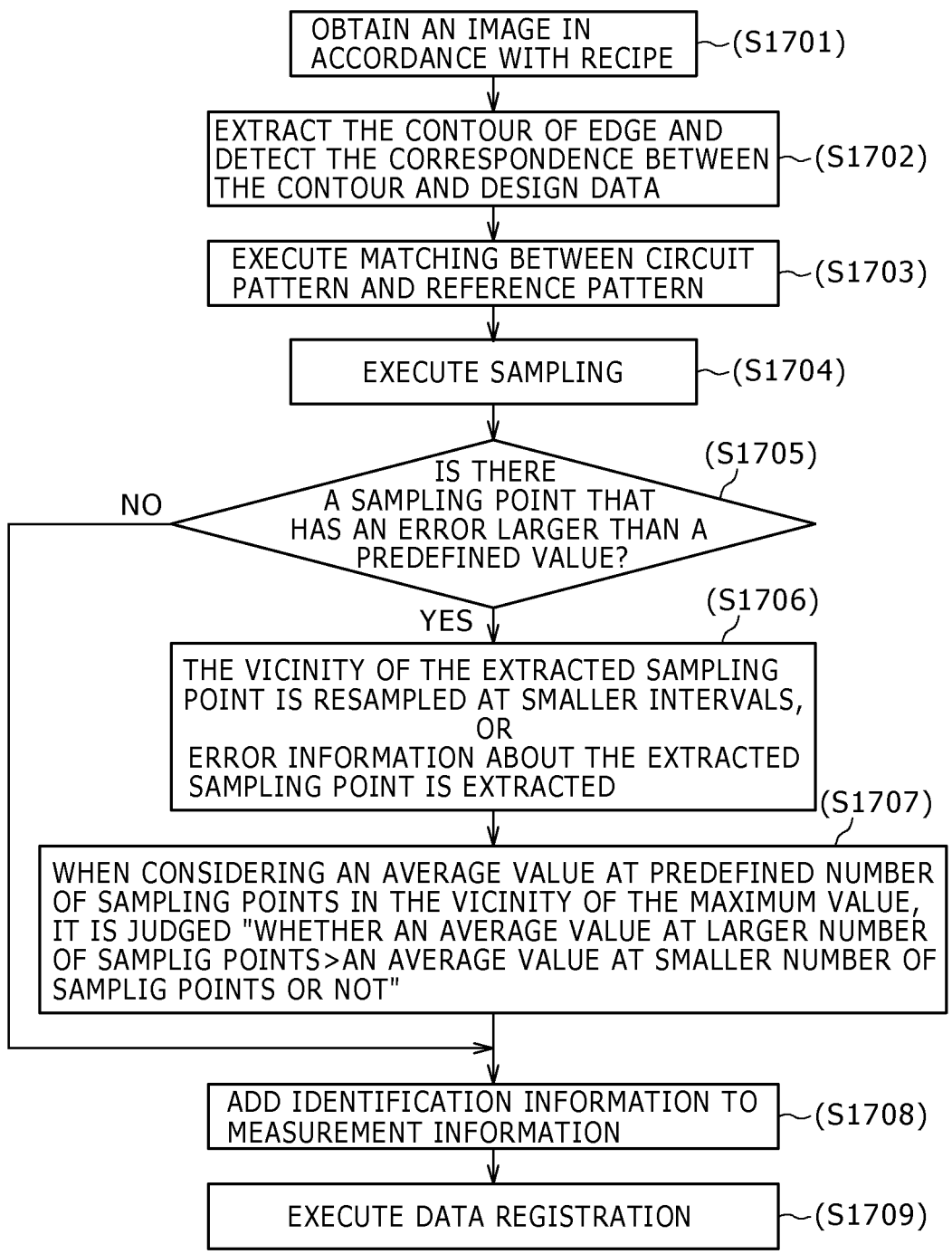
FIG. 17 is a flowchart showing the process for selecting a second measured value aggregation based on the result of a first measured value aggregation.

FIG. 17 is a flowchart showing a measurement process. First, the control device 220 controls the SEM 201 in accordance with a recipe created by the imaging recipe creation device 212 so that an image in a desired position is obtained (at step 1701). Next, the contour line of the circuit pattern is extracted from the image, and by detecting the correspondence between each line segment of the contour line and design data if necessary, identification information is added to each line segment of the contour line (at step 1702). Subsequently, pattern matching between the circuit pattern and the reference is executed (at step 1703). Sampling is executed in order to measure distances between the circuit pattern and the reference pattern between which matching has already been executed (at step 1704). In this example, distances between measurement points shown by circle marks in FIG. 14 and the corresponding points are measured first. FIG. 16(a) is a graph obtained by plotting measured values for this measurement, and shows the measurement results which are obtained when the measurement is performed in the direction from the uppermost part of the surface of the drawing sheet of FIG. 14 to the lowermost part. It is judged whether there is a measurement point larger than a predefined threshold 1604 or not among these plural measurement results (at step 1705). If there is no measurement point larger than the predefined threshold 1604, information about that effect is added to the measurement information, and the data is registered (at step 1708 and step 1709).

On the other hand, if there is a measurement result larger than the predefined threshold 1604, sampling is executed in the vicinity of the extracted sampling point (for example, in a predefined range, or a predefined sampling number of times and at predefined intervals) at narrower intervals (at step 1706). For example, if sampling is executed at a sampling rate that is double the sampling rate shown in FIG. 16, measurement results (shown by circle marks and square marks) in FIG. 16(c) are obtained, and if sampling is executed at a sampling rate that is fourfold the sampling rate shown in FIG. 16, measurement results (shown by circle marks, square marks, and triangle marks) in FIG. 16(e) are obtained. In addition, when considering an average value of measured values in the vicinity of a sampling point that shows the maximum value (for example, at a predefined number of sampling points), if "an average value of measured values at a larger number of sampling points>an average value of measured values at a smaller number of sampling points" (or if "an average value of measured values at a larger number of sampling points>an average value of measured values at a smaller number of sampling points, and there is a deviance equal to or larger than a predefined value"), there are cases where a part of pattern is formed in a bundled state as shown in FIG. 14. Therefore, since there may be a defect, information about that effect is added to the measurement information, and the data is registered.

In the case where there is a bundle in the circuit pattern as illustrated in FIG. 16(b), FIG. 16(d), and FIG. 6(f), when comparing measured values at the upper n points in FIG. 16(b), those in FIG. 16(d), and those in FIG. 6(f) (1601, 1602, and 1603) with each other (where n is the number of sampling points), it turns out that an additional value, an average value, an integral value, or the like of measured values measured at the upper n points of a larger number of sampling points are larger than that of measured values measured at the n points of a smaller number of sampling points. In other words, in the case where values, which are obtained by increasing or decreasing the number of sampling points in a region where a bundle may occur, satisfy a predefined condition, a type of defect in the region can be identified. In this example, it can be identified whether a deformation that regionally and remarkably occurs is caused by noise that locally occurs, or the deformation is caused by a bundle having a predefined size.

In addition, according to such an algorithm, since the acquisition area of a second measured value aggregation measured at a high sampling rate can be selected on the basis a first measured value aggregation value measured first at a low sampling rate, necessary information can be obtained based on the high sampling rate while the number of sampling points being prevented from increasing. Further, it is conceivable that, after performing measurement at a high sampling rate, the above algorithm is applied only for identifying a defect. Even in this case, since a defect or the deformation state of a pattern can be judged based on an AND condition of plural pieces of information, an accurate classification can be executed.

LIST OF REFERENCE SIGNS

201 . . . SEM
202 . . . Electron Beam
203 . . . Sample
204 . . . Secondary Electron Detector
205 . . . Reflection Electron Detector 1
206 . . . Reflection Electron Detector 2
207 . . . A/D Converter
208 . . . Memory
209 . . . CPU
210 . . . Hardware
211 . . . Display
212 . . . Image Pickup Recipe Creation Device
213 . . . Design Data
214 . . . Device That Predicts a Defect
215 . . . Appearance Inspection Device
301, 502, 602, 702, 1002, 1102 . . . Reference Pattern
302, 503, 603, 703, 1103 . . . Circuit Pattern
303, 501, 601, 701, 1003, 1104 . . . Measurement Area
304 . . . Distance
305 . . . Measurement Point
504 . . . Defect
505 . . . Second Measured Value Aggregation
604 . . . Measured Value
1000, 1100 . . . GUI Screen
1001 . . . Reference Parameter Display Window
1004 . . . Inspection Parameter Setting window
1101 . . . Circuit Parameter Display Window
1105 . . . Inspection Result Display Window

The invention claimed is:

1. A pattern measurement apparatus for measuring dimensions between a plurality of measurement points of different positions of an edge of a reference pattern and a plurality of corresponding points of a circuit pattern of an electronic device, the pattern measurement apparatus comprising:
an image processor configured to measure the dimensions based on a detection signal obtained by scanning the electronic device with a charged particle beam;
a control computer to which the image processor is coupled;
a memory storing a program which, when executed, causes the control computer to:
receive a sampling condition from a user, the sampling condition including inspection parameters including a sampling number, priority information about measured values, and a noise judgement threshold;

receive image data from a charged particle beam apparatus;

read reference pattern data, including a first attribute data area in a flat portion of the reference pattern and a second attribute area in a convex portion of the reference pattern, from the memory;

superimpose the received image data and the reference pattern data by using a pattern matching algorithm stored in the memory;

set a plurality of corresponding points on the circuit pattern corresponding to a plurality of measurement points included in the reference pattern data;

measure distances between the corresponding points and the measurement points, both of which exist in a predefined measurement area;

group a plurality of measured values, indicating a measured distance according to a measurement direction between the measurement points and the corresponding points, as a first measured value group based on the sampling condition input by the user and based on whether the measurement points are located in the flat portion or the convex portion of the reference pattern, wherein the measurement direction is set within a predefined angular range;

reorder the first measured value group in descending order of the measured distance, and select a second measured value group of the measured values from the reordered first measured value group after omitting a number of measured values at a beginning of the descending order; and output a display output of at least one of a measurement result in a specific direction range, a measurement result outside of the reference pattern, and a measurement result inside of the reference pattern by performing a statistical value calculation for the measurement direction on the second measured value group of the measured values; and a graphical user interface configured to allow the user to set the sampling condition and configured to display the display output to the user.

2. The pattern measurement apparatus according to claim 1, wherein the calculation device compares the measured values with a predefined threshold, and judges a defect of the circuit pattern.

3. The pattern measurement apparatus according to claim 1, wherein the calculation device selects a predefined number of large measured values out of the measured values at the points as second measured values.

4. The pattern measurement apparatus according to claim 3, wherein the calculation device selects a predefined number of measured values in descending order out of the measured values as candidates of a measured value aggregation.

5. The pattern measurement apparatus according to claim 3, wherein the calculation device selects the second measured values in accordance with directions of corresponding points that correspond to the measurement points.

6. The pattern measurement apparatus according to claim 1, wherein the calculation device adds identification information to the measured values in accordance with whether the measurement places or corresponding points are inside or outside the reference pattern.

7. A semiconductor measurement system, comprising:

a pattern measurement apparatus for measuring dimensions between a plurality of measurement points of different positions of an edge of a reference pattern and a plurality of corresponding points of a circuit pattern of an electronic device, the pattern measurement apparatus including:

an image processor configured to measure the dimensions based on a detection signal obtained by scanning the electronic device with a charged particle beam;

a control computer to which the image processor is coupled;

a memory storing a program which, when executed, causes the control computer to:

receive a sampling condition from a user, the sampling condition including inspection parameters including a sampling number, priority information about measured values, and a noise judgement threshold;

receive image data from a charged particle beam apparatus;

read reference pattern data, including a first attribute data area in a flat portion of the reference pattern and a second attribute area in a convex portion of the reference pattern, from the memory;

superimpose the received image data and the reference pattern data by using a pattern matching algorithm stored in the memory;

set a plurality of corresponding points on the circuit pattern corresponding to a plurality of measurement points included in the reference pattern data;

measure distances between the corresponding points and the measurement points, both of which exist in a predefined measurement area;

group a plurality of measured values, indicating a measured distance according to a measurement direction between the measurement points and the corresponding points, as a first measured value group based on the sampling condition input by the user and based on whether the measurement points are located in the flat portion or the convex portion of the reference pattern, wherein the measurement direction is set within a predefined angular range;

reorder the first measured value group in descending order of the measured distance, and select a second measured value group of the measured values from the reordered first measured value group after omitting a number of measured values at a beginning of the descending order; and output a display output of at least one of a measurement result in a specific direction range, a measurement result outside of the reference pattern, and a measurement result inside of the reference pattern by performing a statistical value calculation for the measurement direction on the second measured value group of the measured values; and a graphical user interface configured to allow the user to set the sampling condition and configured to display the display output to the user; and a scanning electron microscope.

8. The semiconductor measurement system according to claim 7, further comprising:

a display that displays the measured values and a defect judgment result obtained based on the measured values.

9. The pattern measurement apparatus according to claim 1,
wherein the calculation device compares a first statistical value of measured values inside a pattern and a second statistical value of measured values outside the pattern with each other, and sets a larger of the first and second statistical values as a measured value.

10. A non-transitory computer-readable medium storing a program that makes a pattern measurement apparatus measure dimensions between a plurality of measurement points of different positions of an edge of a reference pattern and a plurality of corresponding points of a circuit pattern of an electronic device, the pattern measurement apparatus comprising an image processor configured to measure the dimensions based on a detection signal obtained by scanning the electronic device with a charged particle beam; a control computer to which the image processor is coupled; and a graphical user interface configured to allow a user to set a sampling condition and to display an output to the user, the program, when executed, causing the control computer to:
receive the sampling condition from the user via the graphical user interface, the sampling condition including inspection parameters including a sampling number, priority information about measured values, and a noise judgement threshold;
receive image data from a charged particle beam apparatus;
read reference pattern data, including a first attribute data area in a flat portion of the reference pattern and a second attribute area in a convex portion of the reference pattern, from the computer-readable medium;
superimpose the received image data and the reference pattern data by using a pattern matching algorithm stored in the computer-readable medium;
set a plurality of corresponding points on the circuit pattern corresponding to a plurality of measurement points included in the reference pattern data;
measure distances between the corresponding points and the measurement points, both of which exist in a predefined measurement area;
group a plurality of measured values, indicating a measured distance according to a measurement direction between the measurement points and the corresponding points, as a first measured value group based on the sampling condition and based on whether the measurement points are located in the flat portion or the convex portion of the reference pattern, wherein the measurement direction is set within a predefined angular range;
reorder the first measured value group in descending order of the measured distance, and select a second measured value group of the measured values from the reordered first measured value group after omitting a number of measured values at a beginning of the descending order; and
output to a display of the graphical user interface at least one of a measurement result in a specific direction range, a measurement result outside of the reference pattern, and a measurement result inside of the reference pattern by performing a statistical value calculation for the measurement direction on the second measured value group of the measured values;
wherein the computer program makes the control computer sample dimension values that satisfy a predefined condition or predefined kinds of dimension value among the plurality of dimension values, and makes the computer program calculate a distance between the edge of the reference pattern and the edge of the circuit pattern based on the sampled dimension values.

* * * * *